United States Patent
Li et al.

(10) Patent No.: US 12,532,620 B2
(45) Date of Patent: Jan. 20, 2026

(54) DISPLAY PANEL AND FABRICATING METHOD THEREOF, LIGHT EMITTING APPARATUS AND DISPLAYING DEVICE

(71) Applicant: BOE Technology Group Co., Ltd., Beijing (CN)

(72) Inventors: Xiaohu Li, Beijing (CN); Weijie Wang, Beijing (CN); Liangliang Kang, Beijing (CN); Zhiqiang Jiao, Beijing (CN); Lu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 472 days.

(21) Appl. No.: 18/015,125

(22) PCT Filed: Feb. 25, 2022

(86) PCT No.: PCT/CN2022/077968
§ 371 (c)(1),
(2) Date: Jan. 9, 2023

(87) PCT Pub. No.: WO2023/159480
PCT Pub. Date: Aug. 31, 2023

(65) Prior Publication Data
US 2024/0244900 A1    Jul. 18, 2024

(51) Int. Cl.
*H10K 59/131*        (2023.01)
*H10K 59/12*         (2023.01)
(Continued)

(52) U.S. Cl.
CPC ....... *H10K 59/131* (2023.02); *H10K 59/1201* (2023.02); *H10K 59/122* (2023.02); *H10K 59/8792* (2023.02)

(58) Field of Classification Search
CPC .. H10K 59/131; H10K 59/1201; H10K 59/00; H10K 59/122; H10K 59/8792; H10H 29/10; H01L 21/50
See application file for complete search history.

(56) References Cited

U.S. PATENT DOCUMENTS

2016/0163940 A1    6/2016  Huang et al.
2016/0218325 A1*   7/2016  Choi ................ H10K 59/8792
(Continued)

FOREIGN PATENT DOCUMENTS

CN    109216329 A    1/2019
CN    111613574 A    9/2020

*Primary Examiner* — Vongsavanh Sengdara
(74) *Attorney, Agent, or Firm* — WHDA, LLP

(57) ABSTRACT

A display panel includes a plurality of driving base plates stacked, each of the driving base plates includes a substrate and a driving unit located on the substrate, orientations of the driving base plates are the same; a plurality of pixel units arranged in an array, each of the pixel units includes a plurality of sub-pixels, and orthographic projections on the substrate of light emitting regions of the sub-pixels in the same pixel unit do not overlap with each other; and each of the driving base plates is provided with at least one sub-pixel on one side away from the substrate, and the driving unit on each of the driving base plates is electrically connected to the at least one sub-pixel; and a quantity of the driving base plates is less than or equal to a quantity of the sub-pixels in one of the pixel units.

14 Claims, 7 Drawing Sheets

(51) Int. Cl.
 *H10K 59/122* (2023.01)
 *H10K 59/80* (2023.01)

(56) References Cited

U.S. PATENT DOCUMENTS

| | | |
|---|---|---|
| 2018/0287008 A1 | 10/2018 | Plößl et al. |
| 2021/0313308 A1 | 10/2021 | Chang et al. |
| 2021/0343828 A1 | 11/2021 | Chaji et al. |
| 2022/0206331 A1* | 6/2022 | Hyun ................. G02F 1/133504 |
| 2022/0254853 A1* | 8/2022 | Kim ..................... H10K 59/352 |
| 2022/0293687 A1* | 9/2022 | Ye ......................... H10K 59/122 |
| 2022/0328582 A1* | 10/2022 | Lee ....................... H10K 59/121 |

* cited by examiner

DISPLAY PANEL AND FABRICATING METHOD THEREOF, LIGHT EMITTING APPARATUS AND DISPLAYING DEVICE

TECHNICAL FIELD

The present application relates to the technical field of displaying, and particularly relates to a display panel and a fabricating method thereof, a light emitting apparatus and a displaying device.

BACKGROUND

With the rapid development of the technique of displaying, high-resolution display products have become one of hot-spot display products in the market. In the related art, the resolutions of the display products are increased by reducing the size of the sub-pixels and reducing the spacing between two neighboring sub-pixels, which may increase the resolutions to a certain extent. However, as limited by the mask design and the fabricating process, the degree of the reduction of the spacing between two neighboring sub-pixels is limited, and it is difficult to further increase the resolutions.

SUMMARY

The embodiments of the present application employ the following technical solutions:

In the first aspect, an embodiment of the present application provides a display panel, and the display panel includes:

a plurality of driving base plates that are stacked, each of the driving base plates includes a substrate and a driving unit located on the substrate, and orientations of the plurality of driving base plates are the same;

a plurality of pixel units that are arranged in an array, each of the pixel units includes a plurality of sub-pixels, and orthographic projections on the substrate of light emitting regions of the plurality of sub-pixels in the same pixel unit do not overlap with each other; and each of the driving base plates is provided with at least one of the sub-pixels on one side that is away from the substrate, and the driving unit on each of the driving base plates is electrically connected to the at least one of the sub-pixels; and a quantity of the driving base plates is less than or equal to a quantity of the sub-pixels in one of the pixel units.

In some embodiments of the present application, the quantity of the driving base plates is less than the quantity of the sub-pixels in one of the pixel units.

In some embodiments of the present application, the display panel includes a first driving base plate and a second driving base plate, and each of the pixel units includes a first sub-pixel, a second sub-pixel and a third sub-pixel;

the first driving base plate includes a first substrate and a plurality of first driving units located on the first substrate, and the second driving base plate includes a second substrate and a plurality of second driving units located on the second substrate;

the second substrate is located on one side of the first driving units that is away from the first substrate, and the second substrate is located between the first driving units and the second driving units;

the first sub-pixel and the second sub-pixel are located on the side of the first driving units that is away from the first substrate, and both of the first sub-pixel and the second sub-pixel are electrically connected to the first driving units; and the third sub-pixel is located on one side of the second driving units that is away from the second substrate, and the third sub-pixel is electrically connected to the second driving units.

In some embodiments of the present application, each of the first driving units includes a first pixel driving circuit and a second pixel driving circuit, and each of the second driving units includes a third pixel driving circuit; and the first sub-pixel is electrically connected to the first pixel driving circuit, the second sub-pixel is electrically connected to the second pixel driving circuit, and the third sub-pixel is electrically connected to the third pixel driving circuit.

In some embodiments of the present application, each of the first driving units further includes a first driving wire and a second driving wire that are located on the first substrate, and the first driving wire and the second driving wire are located in a same layer:

the first driving wire is electrically connected to the first pixel driving circuit, and the second driving wire is electrically connected to the second pixel driving circuit; and each of the second driving units includes a third driving wire located on the second substrate, and the third driving wire is electrically connected to the third pixel driving circuit.

In some embodiments of the present application, each of the first driving units further includes a first driving wire, a second driving wire and a third driving wire that are located on the first substrate; and the first driving wire, the second driving wire and the third driving wire are arranged in a same layer, the first driving wire is electrically connected to the first pixel driving circuit, the second driving wire is electrically connected to the second pixel driving circuit, and the third driving wire is electrically connected to the third pixel driving circuit.

In some embodiments of the present application, the display panel further includes an electrically conducting unit, the electrically conducting unit is located between the second substrate and the first driving units, and an orthographic projection of the electrically conducting unit on the first substrate and orthographic projections of the light emitting regions of the plurality of sub-pixels on the first substrate do not overlap with each other:

the second substrate is provided with an extending-throughout first via hole, an orthographic projection of the first via hole on the first substrate and the orthographic projection of the electrically conducting unit on the first substrate overlap, each of the first driving units is provided with a second via hole, and an orthographic projection of the second via hole on the first substrate and the orthographic projection of the electrically conducting unit on the first substrate overlap; and the third pixel driving circuit is electrically connected to the third driving wire via sequentially the first via hole, the electrically conducting unit and the second via hole.

In some embodiments of the present application, the display panel further includes a black-matrix layer, and the black-matrix layer is located on one side of the third sub-pixel that is away from the second substrate; and an orthographic projection of the black-matrix layer on the first substrate and orthographic projections of the light emitting regions of the plurality of sub-pixels on the first substrate do not overlap with each other.

In some embodiments of the present application, the display panel further includes a light transmitting layer, the light transmitting layer and the black-matrix layer are located in a same layer, and an orthographic projection of the light transmitting layer on the first substrate and orthographic projections of the light emitting regions of the sub-pixels on the first substrate overlap.

In some embodiments of the present application, the light transmitting layer includes a first optical filter, a second optical filter and a third optical filter;
- an orthographic projection of the first optical filter on the first substrate and an orthographic projection of a light emitting region of the first sub-pixel on the first substrate overlap, an orthographic projection of the second optical filter on the first substrate and an orthographic projection of a light emitting region of the second sub-pixel on the first substrate overlap, and an orthographic projection of the third optical filter on the first substrate and an orthographic projection of a light emitting region of the third sub-pixel on the first substrate overlap; and
- a color of the first optical filter and a color of a light emitted by the first sub-pixel are the same, a color of the second optical filter and a color of a light emitted by the second sub-pixel are the same, and a color of the third optical filter and a color of a light emitted by the third sub-pixel are the same.

In some embodiments of the present application, the display panel further includes a light-exiting-side encapsulation layer, and the light-exiting-side encapsulation layer covers the third sub-pixel;
- the light-exiting-side encapsulation layer includes at least a first encapsulation sublayer and a second encapsulation sublayer; and
- the black-matrix layer is located between the first encapsulation sublayer and the second encapsulation sublayer.

In some embodiments of the present application, each of the first pixel driving circuit, the second pixel driving circuit and the third pixel driving circuit includes a transistor;
- each of the first sub-pixel, the second sub-pixel and the third sub-pixel includes a light emitting device; and
- the transistor in the first pixel driving circuit is electrically connected to the light emitting device of the first sub-pixel and the first driving wire, the transistor in the second pixel driving circuit is electrically connected to the light emitting device of the second sub-pixel and the second driving wire, and the transistor in the third pixel driving circuit is electrically connected to the light emitting device of the third sub-pixel and the third driving wire.

In some embodiments of the present application, the display panel further includes a protecting layer, the protecting layer is located between the first driving base plate and the second driving base plate, and the protecting layer covers at least the electrically conducting unit.

In some embodiments of the present application, the display panel further includes a fixing unit, and the fixing unit is located between the first driving base plate and the second driving base plate; and
- the fixing unit includes an adhesively bonding layer or a fixing member.

In some embodiments of the present application, the first sub-pixel includes a red-color light emitting device, the second sub-pixel includes a green-color light emitting device, and the third sub-pixel includes a blue-color light emitting device.

In some embodiments of the present application, the quantity of the driving base plates is equal to the quantity of the sub-pixels in one of the pixel units.

In some embodiments of the present application, the display panel includes a first driving base plate, a second driving base plate and a third driving base plate that are sequentially stacked, and each of the pixel units includes a first sub-pixel, a second sub-pixel and a third sub-pixel;
- the first sub-pixel is located between the first driving base plate and the second driving base plate, and is electrically connected to the driving unit in the first driving base plate;
- the second sub-pixel is located between the second driving base plate and the third driving base plate, and is electrically connected to the driving unit in the second driving base plate; and
- the third sub-pixel is located on one side of the third driving base plate that is away from the first driving base plate, and is electrically connected to the driving unit in the third driving base plate.

In the second aspect, an embodiment of the present application provides a displaying device, and the displaying device includes the display panel stated above.

In the third aspect, an embodiment of the present application provides a light emitting apparatus, and the light emitting apparatus includes the display panel stated above.

In the fourth aspect, an embodiment of the present application provides a method for fabricating a display panel, and the method includes:
- providing a plurality of driving base plates, each of the driving base plates includes a substrate and a driving unit located on the substrate;
- forming at least one sub-pixel on each of the driving base plates, the sub-pixel is located on one side of the driving base plate that is away from the substrate, and is electrically connected to the driving unit; and
- matching and adhering together the plurality of driving base plates, orientations of the plurality of driving base plates are the same, the sub-pixels in a same one pixel unit are located on different driving base plates, and orthographic projections on one of the substrates of light emitting regions of the plurality of sub-pixels in the same pixel unit do not overlap with each other; and a quantity of the driving base plates is less than or equal to a quantity of the sub-pixels in one of the pixel units.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the drawings that are required to describe the embodiments or the prior art will be briefly described below. Apparently, the drawings that are described below are merely embodiments of the present application, and a person skilled in the art may obtain other drawings according to these drawings without paying creative work.

FIGS. 2 and 3 are schematic structural diagrams of two types of driving base plates according to the embodiments of the present application;

DETAILED DESCRIPTION

Figure 1:
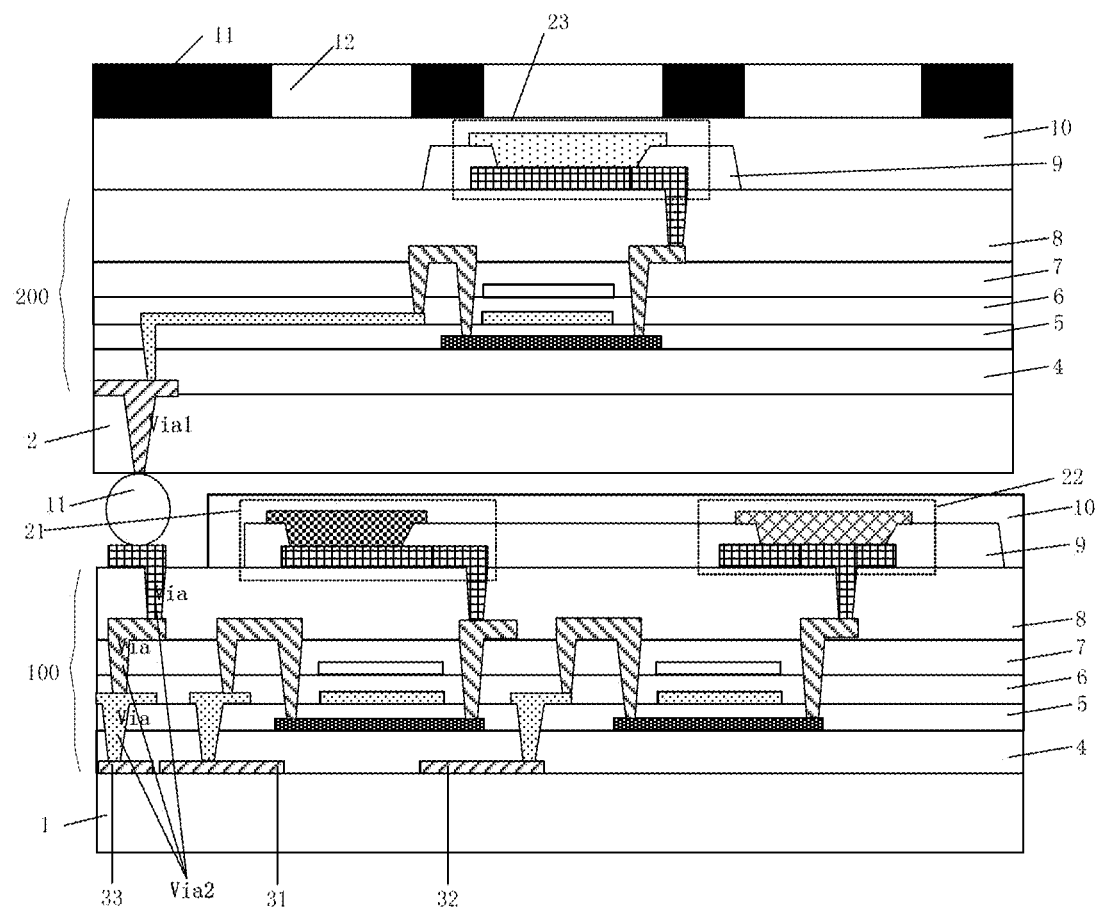
FIGS. 1 and 2-9 are schematic structural diagrams of eight types of display panels according to the embodiments of the present application.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the drawings, in order for clarity, the thicknesses of the regions and the layers might be exaggerated. In the drawings, the same reference numbers represent the same or similar components, and therefore the detailed description on them are omitted. Moreover, the drawings are merely schematic illustrations of the present application, and are not necessarily drawn to scale.

Unless stated otherwise in the context, throughout the description and the claims, the term "include" is interpreted as the meaning of opened containing, i.e., "including but not limited to". In the description of the present disclosure, the terms "one embodiment", "some embodiments", "exemplary embodiments", "example", "specific example" or "some examples" are intended to indicate that specific features, structures, materials or characteristics related to the embodiment or example are included in at least one embodiment or example of the present application. The illustrative indication of the above terms does not necessarily refer to the same one embodiment or example. Moreover, the specific features, structures, materials or characteristics may be included in any one or more embodiments or examples in any suitable manner.

In the embodiments of the present application, terms such as "first" and "second" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features.

With the rapid development of the technique of displaying, high-resolution display products have become one of hot-spot display products in the market. In the related art, the resolutions of the display products are increased by reducing the size of the sub-pixels and reducing the spacing between two neighboring sub-pixels, which may increase the resolutions to a certain extent. However, as limited by the mask design and the fabricating process, the degree of the reduction of the spacing between two neighboring sub-pixels is limited, and it is difficult to further increase the resolutions.

Figure 12:
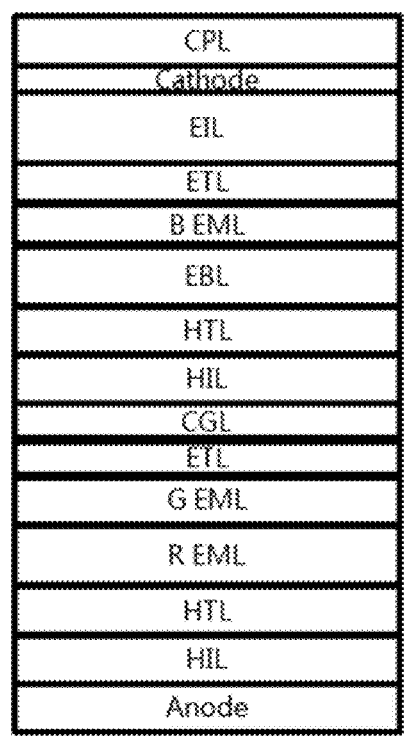
FIGS. 12 and 13 are schematic structural diagrams of two types of display panels in the related art.
Figure 13:
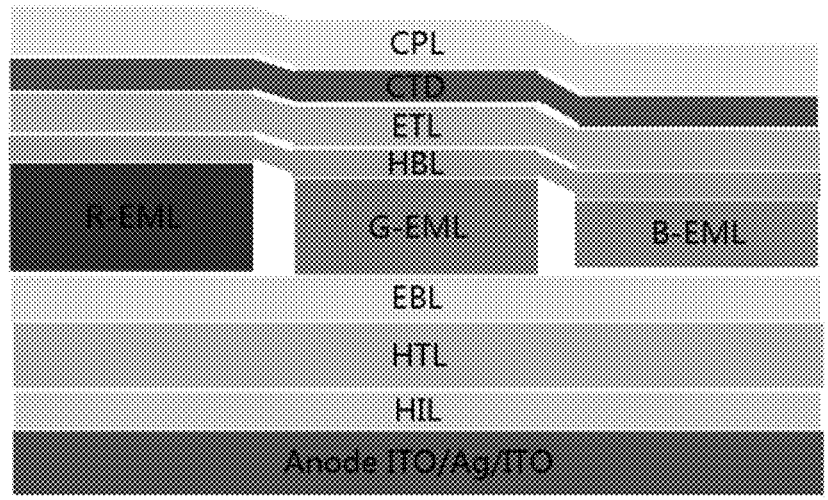

Particularly, regarding the white organic light emitting diode (WOLED) display product shown in FIG. 12, because a plurality of luminescent layers (EML) are stacked, it has a low efficiency, a large driving voltage and a high power consumption. Moreover, regarding the RED/Green/Blue side by side organic light emitting diode (RGB SBS OLED) display product shown in FIG. 13, although it has a higher efficiency and a lower power consumption, when it is applied to high-resolution display products, as limited by the fabricating process of the luminescent layer and the fine metal mask (referred to for short as FMM), the spacing between two neighboring sub-pixels is above 18 μm, and is difficult to be further reduced.

The WOLED display product shown in FIG. 12 includes an anode (Anode), a hole injection layer (HIL), a hole transporting layer (HTL), a red-color luminescent layer (R EML), a green-color luminescent layer (G EML), an electron transporting layer (ETL), a charge generating layer (CGL), a hole injection layer (HIL), a hole transporting layer (HTL), an electron blocking layer (EBL), a blue-color luminescent layer (B EML), an electron transporting layer (ETL), an electron injection layer (EIL), a cathode (Cathode) and a light enhancing layer (CPL) that are sequentially stacked. The RGB SBS OLED display product shown in FIG. 13 includes an anode (Anode), a hole injection layer (HIL), a hole transporting layer (HTL), an electron blocking layer (EBL), a red-color luminescent layer (R EMIL), a green-color luminescent layer (G EML) and a blue-color luminescent layer (B EML) that are placed side by side, a hole blocking layer (HBL), an electron transporting layer (ETL), a cathode (CTD) and a light enhancing layer (CPL).

In view of that, an embodiment of the present application provides a display panel, and the display panel includes:
  a plurality of driving base plates that are stacked, each of the driving base plates includes a substrate and a driving unit located on the substrate, and orientations of the plurality of driving base plates are the same;
  a plurality of pixel units that are arranged in an array, each of the pixel units includes a plurality of sub-pixels, and orthographic projections on the substrate of light emitting regions of the sub-pixels in the same pixel unit do not overlap with each other; and each of the driving base plates is provided with at least one of the sub-pixels on one side that is away from the substrate, and the driving unit on each of the driving base plates is electrically connected to the at least one of the sub-pixels; and
  a quantity of the driving base plates is less than or equal to a quantity of the sub-pixels in one of the pixel units.

In an exemplary embodiment, the display panel includes two driving base plates, and the first part of the sub-pixels in a same pixel unit are located on the side of one of the driving base plates that is away from its substrate, and are electrically connected to its driving unit; and the second part of the sub-pixels in a same pixel unit are located on the side of the other of the driving base plates that is away from its substrate, and are electrically connected to its driving unit.

That the orientations of the plurality of driving base plates are the same means that the light-emission directions of the light emitting regions of the plurality of sub-pixels on the driving base plates are the same.

In an exemplary embodiment, the light emitting regions of the plurality of sub-pixels mean that each of the sub-pixels includes a light emitting functional layer, the light emitting functional layer is located at least in an opening of a pixel defining layer, and the light emitting functional layer located in the opening is capable of contacting the anode and emitting light. Therefore, the part of the light emitting functional layer that is located in the opening is referred to as the light emitting region of the sub-pixel. The meaning of the light emitting regions of the plurality of sub-pixels referred to below is similar to that, and is not discussed further.

It should be noted that that the light emitting functional layer is located at least in the opening of the pixel defining layer means that the light emitting functional layer may be located in the opening of the pixel defining layer, or the light emitting functional layer may not only be located in the opening of the pixel defining layer, but also may extend to the region outside the opening.

In an exemplary embodiment, referring to FIG. 1, the display panel includes two driving base plates, and each of the pixel units of the display panel includes three sub-pixels. The first driving base plate includes a first substrate 1 and a first driving unit 100, and the second driving base plate includes a second substrate 2 and a second driving unit 200. Each of the driving base plates is provided with at least one of the sub-pixels on the side that is away from its substrate.

In an exemplary embodiment, the display panel includes a plurality of driving base plates, and the quantity of the driving base plates is less than or equal to the quantity of the sub-pixels in one of the pixel units. It can be understood that the display panel may include at least two driving base plates, and may include at most N driving base plates, and N refers to the quantity of the sub-pixels included in one of the pixel units of the display panel. The quantity of the sub-pixels included in one of the pixel units is not limited herein, and may be particularly determined according to practical situations.

In some embodiments of the present application, the quantity of the driving base plates is less than the quantity of the sub-pixels in one of the pixel units.

In some embodiments of the present application, the quantity of the driving base plates is equal to the quantity of the sub-pixels in one of the pixel units.

In an exemplary embodiment, when the quantity of the sub-pixels in one of the pixel units of the display panel is three, the display panel may include two driving base plates that are stacked, or the display panel may include three driving base plates that are stacked. The driving unit on each of the driving base plates is electrically connected to the at least one of the sub-pixels.

The particular structures of each of the driving base plates of the display panel are not limited herein, and may be determined according to practical situations.

Each of the driving units of the driving base plates may include a pixel driving circuit and a trace connecting the pixel driving circuit and the driving chip of the display panel. The particular structure of the driving units is not limited herein, and may be determined according to practical situations.

In an exemplary embodiment, the substrate may be a flexible substrate, for example, polyimide (PI). Alternatively, the substrate may be a rigid substrate, for example, glass.

In an exemplary embodiment, the displaying colors of the sub-pixels included in one of the pixel units may be the same. For example, all of the sub-pixels in one of the pixel units display the white color, or all of the sub-pixels in one of the pixel units display the blue color.

In an exemplary embodiment, the displaying colors of the sub-pixels included in one of the pixel units may be different. For example, the sub-pixels in one of the pixel units display the red color, the green color and the blue color, respectively. Alternatively, the sub-pixels in one of the pixel units display the red color, the green color, the blue color and the white color, respectively.

The particular type of the display panel is not limited herein. The embodiments of the present application illustrate by taking the case as an example in which the display panel is an OLED display panel. In an exemplary application, the OLED display panel may be used for displaying, or the OLED display panel may be used for a backlight.

In the embodiments of the present application, the plurality of driving base plates are provided, so that the plurality of sub-pixels in one of the pixel units are located on the different driving base plates, and the quantity of the driving base plates of the display panel is less than or equal to the quantity of the sub-pixels in one of the pixel units. Accordingly, in the fabrication of the display panel, the plurality of driving base plates may be adhered together by using a matching-adhering technique, and the orientations of all of the driving base plates are the same.

Accordingly, the fabrication of the display panel prevents, as in the related art, fabricating all of the sub-pixels of one pixel unit on one driving base plate, and prevents the problem in the related art that the limitation by the fabricating process and the limitation by the size of the mask cause that the spacing between two neighboring sub-pixels may not be further reduced. Accordingly, the plurality of driving base plates may be adhered together by using a matching-adhering technique, and display products of a lower sub-pixel spacing may be designed and fabricated according to demands, thereby increasing the resolution of the display panel.

It should be noted that the "plurality of" as used in the embodiments of the present application refers to "two or more", which is not discussed further below.

Figure 2:
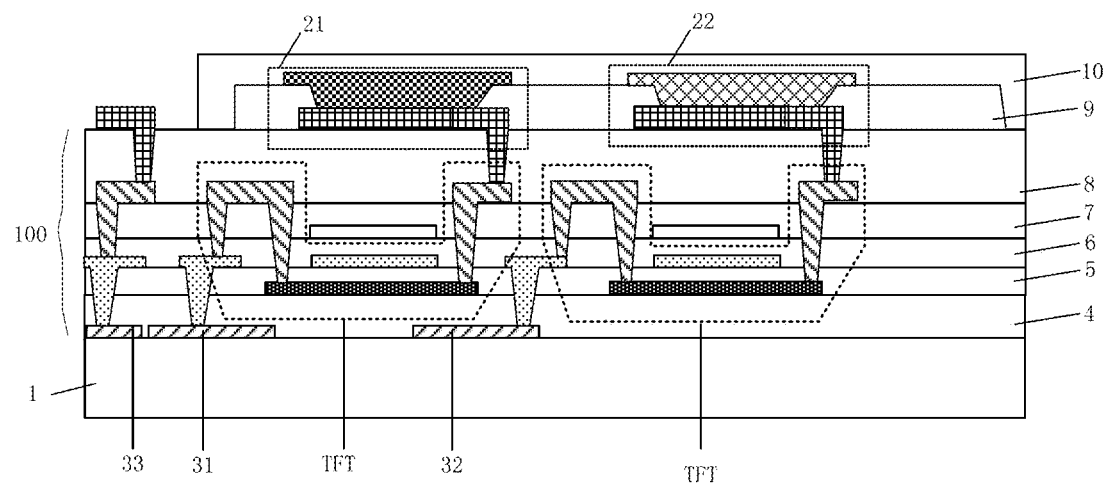
Figure 3:
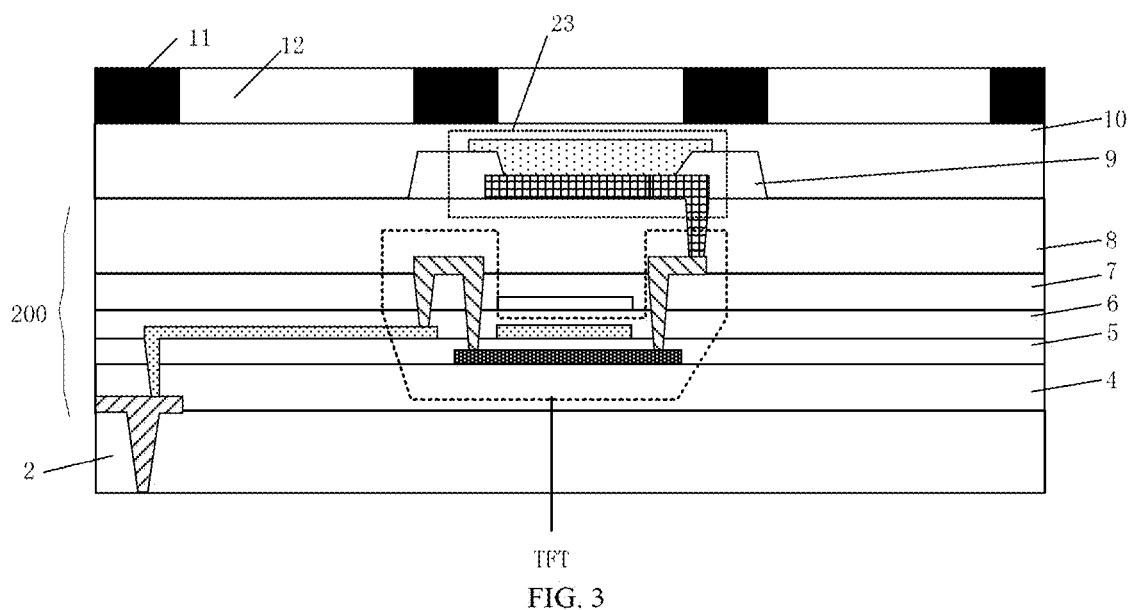

In some embodiments of the present application, the display panel includes a first driving base plate shown in FIG. 2 and a second driving base plate shown in FIG. 3, and each of the pixel units includes a first sub-pixel 21, a second sub-pixel 22 and a third sub-pixel 23.

The first driving base plate includes a first substrate 1 and a plurality of first driving units 100 located on the first substrate 1, and the second driving base plate includes a second substrate 2 and a plurality of second driving units 200 located on the second substrate 2. Referring to FIG. 1, the second substrate 2 is located on the side of the first driving units 100 that is away from the first substrate 1, and the second substrate 2 is located between the first driving units 100 and the second driving units 200.

The first sub-pixel 21 and the second sub-pixel 22 are located on the side of the first driving units 100 that is away from the first substrate 1, and both of the first sub-pixel 21 and the second sub-pixel 22 are electrically connected to the first driving units 100. The third sub-pixel 23 is located on the side of the second driving units 200 that is away from the second substrate 2, and the third sub-pixel 23 is electrically connected to the second driving units 200.

The materials of the first substrate 100 and the second substrate 200 may be the same. As an example, both of the first substrate 100 and the second substrate 200 are rigid substrates, or both of the first substrate 100 and the second substrate 200 are flexible substrates.

The materials of the first substrate 100 and the second substrate 200 may be different. As an example, the first substrate 100 is a rigid substrate, for example, glass, and the second substrate 200 is a flexible substrate, for example, polyimide (PI).

The particular structures of the first driving units 100 and the second driving units 200 are not limited herein. As an example, each of the driving units (including the first driving units and the second driving units) may include a pixel driving circuit and a trace between the pixel driving circuit and the driving chip of the display panel.

As an example, each of the first driving units 100 may include two pixel driving circuits, and each of the second driving units 200 may include one pixel driving circuit.

As an example, each of the pixel driving circuits is connected to one sub-pixel.

The structure of the pixel driving circuits of the driving units is not limited herein, and may be particularly determined according to practical situations. As an example, the pixel driving circuit may include two thin-film transistors and one storage capacitor (2T1C). Alternatively, the pixel driving circuit may include four thin-film transistors and one storage capacitor (4T1C). Alternatively, the pixel driving circuit may include five thin-film transistors and one storage capacitor (5T1C). Alternatively, the pixel driving circuit may include seven thin-film transistors and one storage capacitor (7T1C). Alternatively, the pixel driving circuit may include eight thin-film transistors and one storage capacitor (8T1C). Alternatively, the pixel driving circuit may include eight thin-film transistors and two storage capacitors (8T2C).

In an exemplary embodiment, the pixel colors of the first sub-pixel 21, the second sub-pixel 22 and the third sub-pixel 23 may be different, or the pixel colors of them may be the same.

As an example, the first sub-pixel 21 may be a red-color sub-pixel, the second sub-pixel 22 may be a green-color sub-pixel, and the third sub-pixel 23 may be a blue-color sub-pixel. Alternatively, the first sub-pixel 21 may be a green-color sub-pixel, the second sub-pixel 22 may be a blue-color sub-pixel, and the third sub-pixel 23 may be a red-color sub-pixel.

In an exemplary embodiment, each of the first sub-pixel 21, the second sub-pixel 22 and the third sub-pixel 23 includes a light emitting device. The light emitting device may be any one of an organic light emitting diode (OLED), a micro light emitting diode (Micro LED) and a mini light emitting diode (Mini LED).

In an exemplary embodiment, a sub-pixel of a higher efficiency may be provided close to the light-exiting surface of the display panel, and a sub-pixel of a lower efficiency may be provided away from the light-exiting surface of the display panel, to increase the overall light efficiency of the display panel.

In an exemplary embodiment, the luminous efficiency of the third sub-pixel 23 is greater than or equal to the luminous efficiency of the first sub-pixel 21, the luminous efficiency of the third sub-pixel 23 is greater than or equal to the luminous efficiency of the second sub-pixel 22, and the distance between the third sub-pixel 23 and the light-exiting surface in the direction perpendicular to one of the substrates of the display panel is greater than or equal to the distances between the other sub-pixels and the light-exiting surface in the direction perpendicular to one of the substrates of the display panel.

It should be noted that the light-exiting surface of the display panel refers to the interface where the displaying light rays of the display panel exit.

In an exemplary embodiment, when the light emitting devices are organic light emitting diodes (OLED) and the pixel colors of the first sub-pixel 21, the second sub-pixel 22 and the third sub-pixel 23 are different, taking the structure shown in FIG. 1 as an example, because the efficiency of the blue-color light emitting device is less than those of the red-color light emitting device and the green-color light emitting device, the third sub-pixel 23 including the blue-color light emitting device may be provided on the driving base plate close to the light-exiting surface of the display panel.

In some embodiments of the present application, each of the first driving units 100 includes a first pixel driving circuit and a second pixel driving circuit, and each of the second driving units 200 includes a third pixel driving circuit.

The first sub-pixel 21 is electrically connected to the first pixel driving circuit, the second sub-pixel 22 is electrically connected to the second pixel driving circuit, and the third sub-pixel 23 is electrically connected to the third pixel driving circuit.

In an exemplary embodiment, the first pixel driving circuit, the second pixel driving circuit and the third pixel driving circuit have the same structure. The first pixel driving circuit is used to drive the first sub-pixel, the second pixel driving circuit is used to drive the second sub-pixel, and the third pixel driving circuit is used to drive the third sub-pixel.

Figure 5:
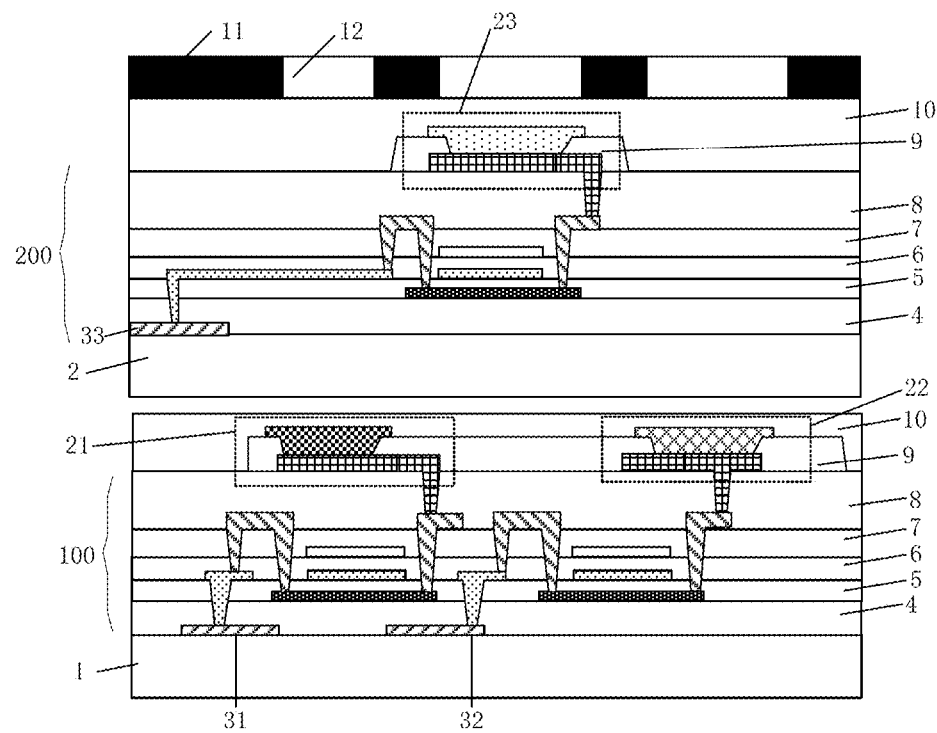
Figures 7, 8:
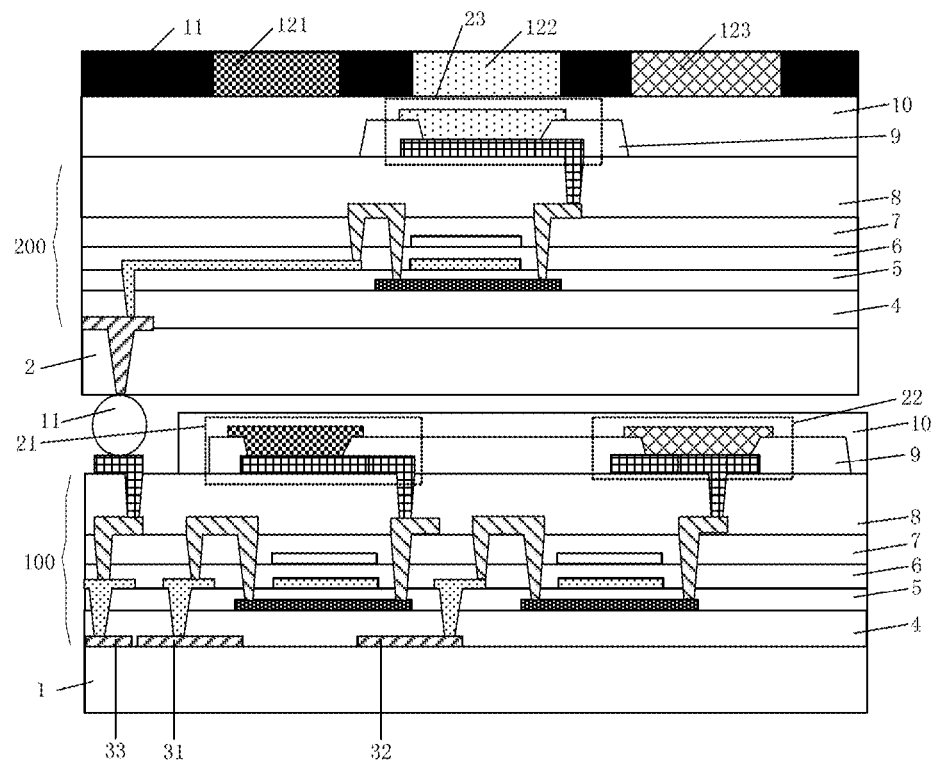

In some embodiments of the present application, referring to FIGS. 5 and 8, each of the first driving units 100 further includes a first driving wire 31 and a second driving wire 32 that are located on the first substrate 1, and the first driving wire 31 and the second driving wire 32 are located in a same layer. The first driving wire 31 is electrically connected to the first pixel driving circuit, and the second driving wire 32 is electrically connected to the second pixel driving circuit.

Each of the second driving units 200 includes a third driving wire 33 located on the second substrate 2, and the third driving wire 33 is electrically connected to the third pixel driving circuit.

In an exemplary embodiment, the first driving wire 31, the second driving wire 32 and the third driving wire 33 are used to electrically connect the pixel driving circuits in the displaying region of the display panel and the driving chips in the bonding region of the display panel together.

As an example, regarding the display panel shown in FIG. 5, because the first driving wire 31 and the second driving wire 32 are located on the same driving base plate, the first driving wire 31 and the second driving wire 32 located on the first driving base plate may be bonded to one driving chip, to drive the first sub-pixels 21 and the second sub-pixels 22 located on the first driving base plate, and the third driving wire 33 located on the second driving base plate may be bonded to another driving chip, to drive the third sub-pixels 23 located on the second driving base plate.

Figure 4:
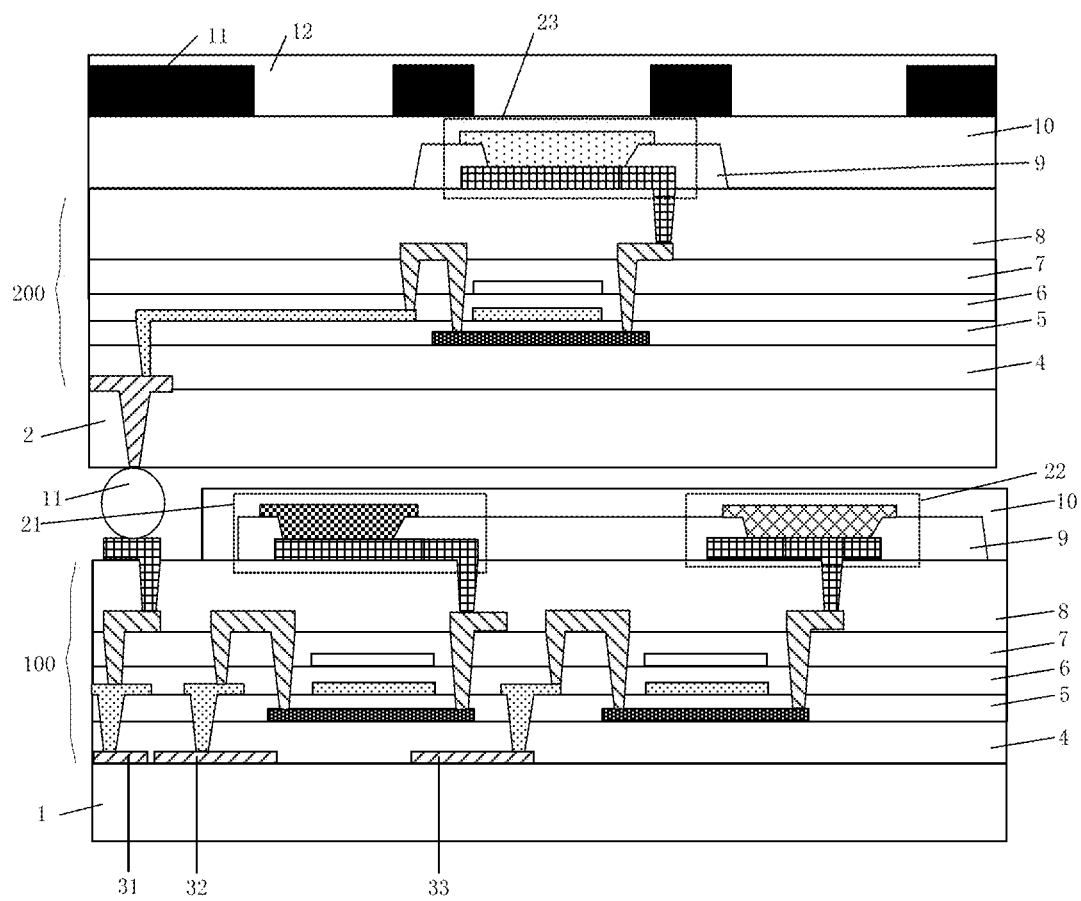

In some embodiments of the present application, refining to FIG. 1 or 4, each of the first driving units further includes a first driving wire 31, a second driving wire 32 and a third driving wire 33 that are located on the first substrate 1. The first driving wire 31, the second driving wire 32 and the third driving wire 33 are arranged in a same layer, the first driving wire 31 is electrically connected to the first pixel driving circuit 21, the second driving wire 32 is electrically connected to the second pixel driving circuit, and the third driving wire is electrically connected to the third pixel driving circuit.

That the first driving wire 31, the second driving wire 32 and the third driving wire 33 are arranged in a same layer refers to that the first driving wire 31, the second driving wire 32 and the third driving wire 33 are located in a same layer, and the first driving wire 31, the second driving wire 32 and the third driving wire 33 are fabricated in a one-step patterning process. The fabrication in a one-step pattering process refers to fabricating in one step of process of film formation, exposure, development and etching.

In an exemplary embodiment, the first driving wire 31 is electrically connected to the first pixel driving circuit 21 by the first pixel driving circuit 21, the second driving wire 32 is electrically connected to the second pixel driving circuit by the second pixel driving circuit, and the third driving wire 33 is electrically connected to the third pixel driving circuit by the third pixel driving circuit.

In an exemplary embodiment, the third driving wire 33 is located on the first driving base plate, both of the third pixel driving circuit and the third sub-pixel are located on the second driving base plate, and the second driving base plate may be perforated, to electrically connect the third pixel driving circuit and the third driving wire 33 via the extending-throughout via hole.

In some embodiments of the present application, referring to FIGS. 1, 4, 6, 7 and 9, the display panel further includes an electrically conducting unit 11, the electrically conducting unit 11 is located between the second substrate 2 and the first driving units 100, and the orthographic projection of the electrically conducting unit 11 on the first substrate 1 and the orthographic projections of the light emitting regions of the sub-pixels (including the first sub-pixel 21, the second sub-pixel 22 and the third sub-pixel 23) on the first substrate 1 do not overlap with each other.

In an exemplary embodiment, the pixel units are located within the displaying region of the display panel, and the electrically conducting unit 11 may be located within the peripheral region of the display panel, and the peripheral region surrounds the displaying region.

The second substrate 2 has an extending-throughout first via hole Via1, the orthographic projection of the first via hole Via1 on the first substrate 1 and the orthographic projection of the electrically conducting unit 11 on the first substrate 1 overlap, each of the first driving units 100 has a second via hole Via2, and the orthographic projection of the second via hole Via2 on the first substrate 1 and the orthographic projection of the electrically conducting unit 11 on the first substrate 1 overlap.

The third pixel driving circuit is electrically connected to the third driving wire 33 via sequentially the first via hole Via1, the electrically conducting unit 11 and the second via hole Via2.

In an exemplary embodiment, the second via hole Via2 is formed by three via holes in communication. Particularly, the second via hole Via2 includes one via hole extending throughout a planarization layer (PLN) 8, one via hole extending throughout an inter-layer dielectric layer (ILD) 7 and a second insulating layer (GI2) 6, and one via hole extending throughout a first insulating layer (GI1) 5 and a buffer layer (Buffer) 4.

In an exemplary embodiment, the electrically conducting unit 11 may include any one of an electrically conducting layer, an electrically conducting sphere and an electrically conductive adhesive.

It should be noted that the embodiments of the present application illustrate the display panel by taking the case as an example in which the electrically conducting unit 11 includes an electrically conducting sphere.

In the embodiments of the present application, by electrically connecting the third driving wire 33 located in the first driving base plate and the third pixel driving circuit located in the second driving base plate together by using the electrically conducting unit 11, the first driving wire 31, the second driving wire 32 and the third driving wire 33 may be bonded together, and the first driving wire 31, the second driving wire 32 and the third driving wire 33 may be connected to the same driving chip, thereby reducing the difficulty in the bonding process.

In some embodiments of the present application, referring to FIGS. 1 and 4, the display panel further includes a black-matrix layer 11, and the black-matrix layer 11 is located on the side of the third sub-pixel 23 that is away from the second substrate 2.

The orthographic projection of the black-matrix layer 11 on the first substrate 1 and the orthographic projections of the light emitting regions of the sub-pixels on the first substrate 1 do not overlap with each other.

In an exemplary embodiment, the black-matrix layer 11 is provided on the driving base plate on the light exiting side. The driving base plate on the light exiting side may be understood as the driving base plate where the light-exiting surface of the display panel is located. The light-exiting surface refers to the plane where the displaying light rays of the display panel exit, and the displaying light rays exit the light-exiting surface and then enter the human eyes.

The black-matrix layer 11 serves to define the sub-pixels, and the particular shape of the orthographic projection of the black-matrix layer 11 on the first substrate 1 is not limited herein. The shape of the orthographic projection of the black-matrix layer 11 is decided by the shapes of the orthographic projections of the light emitting regions of the sub-pixels and the arrangement mode of the sub-pixels, and may be particularly determined according to practical situations.

Figure 10:
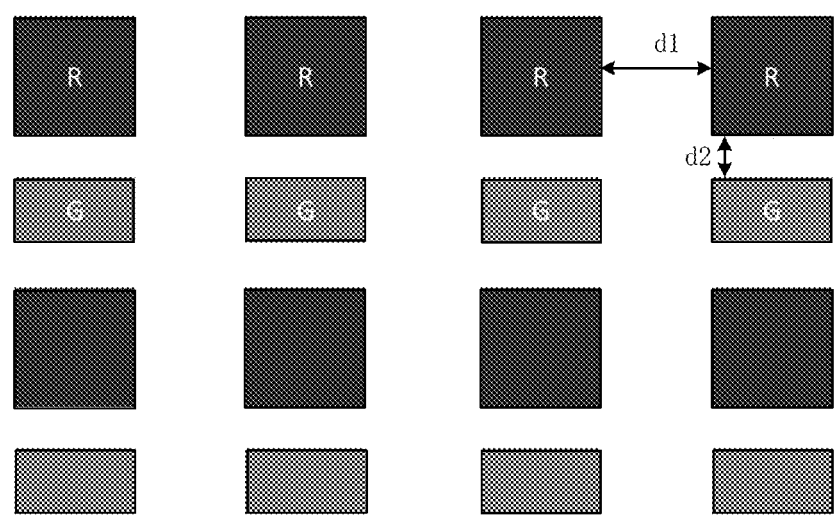
FIGS. 10 and 11 are schematic diagrams of the projections of different sub-pixels according to the embodiments of the present application.

FIG. 10 provides a schematic diagram of the orthographic projections on the first substrate 1 of the light emitting regions of the second sub-pixels 22 and the light emitting regions of the third sub-pixels 23 on the second driving base plate. The distance between the light emitting regions of two neighboring second sub-pixels 22 is d1, the distance between the light emitting regions of two neighboring third sub-pixels 23 is d1, and the distance between the light emitting region of the second sub-pixel 22 and the light emitting region of the third sub-pixel 23 is d2.

It can be understood that, when the sub-pixels and the black-matrix layer are projected to one plane, the distance between the projections of the light emitting regions of two second sub-pixels 22 is d1, and therefore the size of the projection of the black-matrix layer 11 between the projections of the light emitting regions of the two second sub-pixels 22 is d1. The distance between the projection of the light emitting region of the second sub-pixel 22 and the projection of the light emitting region of the third sub-pixel 23 is d2, and therefore the size of the projection of the black-matrix layer 11 therebetween is also d2.

In an exemplary embodiment, d1 is greater than or equal to 10 μm, and d2 is greater than or equal to 10 μm.

Figure 11:
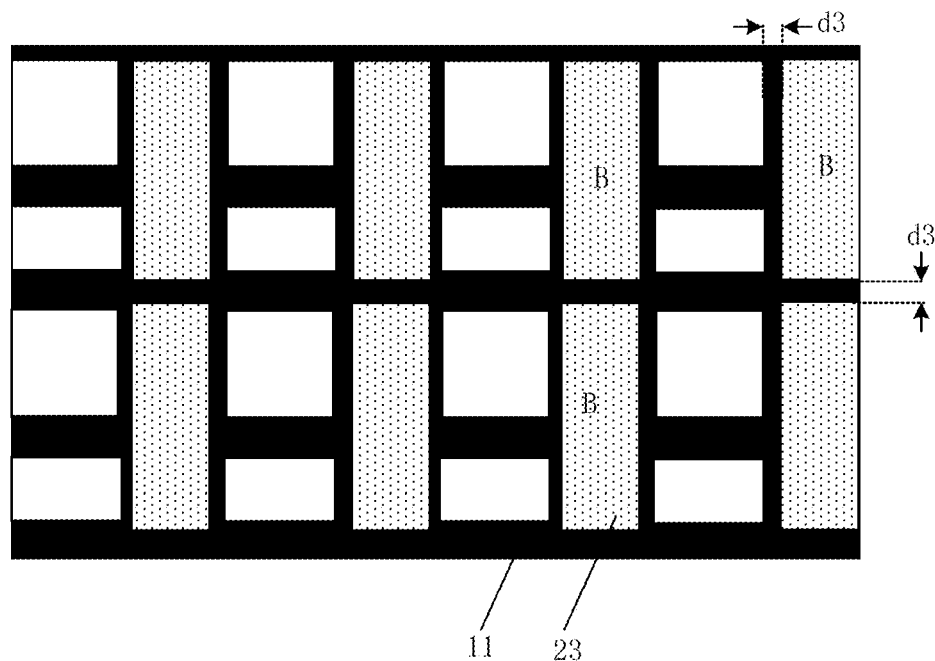

FIG. 11 provides a schematic diagram of the orthographic projections on the first substrate 1 of the light emitting regions of the third sub-pixels 23 on the first driving base plate and the black-matrix layer 11. The distance between the light emitting regions of two neighboring third sub-pixels 23 is d3, the distance between the light emitting region of the third sub-pixel 23 and the light emitting region of the first sub-pixel 21 is also d3, and the distance between the light emitting region of the third sub-pixel 23 and the light emitting region of the second sub-pixel 22 is also d3.

In an exemplary embodiment, d3 is less than or equal to 2 μm.

It should be noted that both of FIGS. 11 and 12 illustrate by taking the case as an example in which the first sub-pixel 21 is a blue-color sub-pixel, the second sub-pixel 22 is a red-color sub-pixel and the third sub-pixel 23 is a green-light sub-pixel.

In the embodiments of the present application, by providing the first sub-pixel 21 on the first driving base plate, providing the second sub-pixel 22 and the third sub-pixel 23 on the second driving base plate, and matching and adhering together the two driving base plates, both of the distance between the first sub-pixel 21 and the second sub-pixel 22 in the direction parallel to the first substrate 1 and the distance between the first sub-pixel 21 and the third sub-pixel 23 in the direction parallel to the first substrate 1 may be controlled to be less than 2 μm, which may increase the aperture ratio and the resolution of the display panel to a large extent, thereby improving the effect of displaying of the display panel.

In some embodiments of the present application, referring to FIG. 5, the display panel further includes a light transmitting layer 12, the light transmitting layer 12 and the black-matrix layer 11 are located in a same layer, and the orthographic projection of the light transmitting layer 12 on the first substrate 1 and the orthographic projections of the light emitting regions of the sub-pixels on the first substrate 1 overlap.

In an exemplary embodiment, that the orthographic projection of the light transmitting layer 12 on the first substrate 1 and the orthographic projections of the light emitting regions of the sub-pixels on the first substrate 1 overlap means that the orthographic projection of the light transmitting layer 12 on the first substrate 1 and the orthographic projection of the light emitting region of the first sub-pixel 21 on the first substrate 1 overlap, the orthographic projection of the light transmitting layer 12 on the first substrate 1 and the orthographic projection of the light emitting region of the second sub-pixel 22 on the first substrate 1 overlap, and the orthographic projection of the light transmitting layer 12 on the first substrate 1 and the orthographic projection of the light emitting region of the third sub-pixel 23 on the first substrate 1 overlap.

In an exemplary embodiment, the material of the light transmitting layer 12 may include a light transmitting material, for example, a light transmitting resin.

In an exemplary embodiment, the materials of the different regions of the light transmitting layer 12 are the same.

As an example, all of the different regions of the light transmitting layer 12 include a colorless light transmitting material.

In an exemplary embodiment, the materials of the different regions of the light transmitting layer 12 are different.

As an example, the region of the light transmitting layer 12 that overlaps with the projection of the light emitting region of the first sub-pixel 21 may include a red-color light transmitting material, the region of the light transmitting layer 12 that overlaps with the projection of the light emitting region of the second sub-pixel 22 may include a green-color light transmitting material, and the region of the light transmitting layer 12 that overlaps with the projection of the light emitting region of the third sub-pixel 23 may include a blue-color light transmitting material.

In an exemplary embodiment, referring to FIG. 3, the light transmitting layer 12 fills and levels up the regions between the patterned black-matrix layer 11, and the orthographic projection of the light transmitting layer 12 on the first substrate 1 and the orthographic projection of the black-matrix layer 11 on the first substrate 1 do not overlap with each other.

In an exemplary embodiment, referring to FIG. 4, the light transmitting layer 12 fills and levels up the regions between the patterned black-matrix layer 11, extends to the surface of the black-matrix layer 11 that is away from the first substrate 1 and covers the black-matrix layer 11. In other words, the thickness of the light transmitting layer 12 in the direction perpendicular to the first substrate 1 is greater than the thickness of the black-matrix layer 11 in the direction perpendicular to the first substrate 1, to realize the planarization.

In some embodiments of the present application, referring to FIG. 7, the light transmitting layer 12 includes a first optical filter 121, a second optical filter 122 and a third optical filter 123.

The orthographic projection of the first optical filter 121 on the first substrate 1 and the orthographic projection of a light emitting region of the first sub-pixel 21 on the first substrate 1 overlap, the orthographic projection of the second optical filter 122 on the first substrate 1 and the orthographic projection of a light emitting region of the second sub-pixel 22 on the first substrate 1 overlap, and the orthographic projection of the third optical filter 123 on the first substrate 1 and the orthographic projection of a light emitting region of the third sub-pixel 23 on the first substrate 1 overlap.

The color of the first optical filter 121 and the color of the light emitted by the first sub-pixel 21 are the same, the color of the second optical filter 122 and the color of the light emitted by the second sub-pixel 22 are the same, and the color of the third optical filter 123 and the color of the light emitted by the third sub-pixel 23 are the same.

In an exemplary embodiment, the first optical filter 121 may be a red-color optical filter, the second optical filter 122 may be a green-light optical filter, and the third optical filter 123 may be a blue-color optical filter.

As an example, the material of the first optical filter 121 may include a red-color photoresist, the material of the second optical filter 122 may include a green-color photoresist, and the material of the third optical filter 123 may include a blue-color photoresist.

As an example, the material of the first optical filter 121 may include a red-color quantum dot, the material of the second optical filter 122 may include a green-color quantum dot, and the material of the third optical filter 123 may include a blue-color quantum dot.

Figure 6:
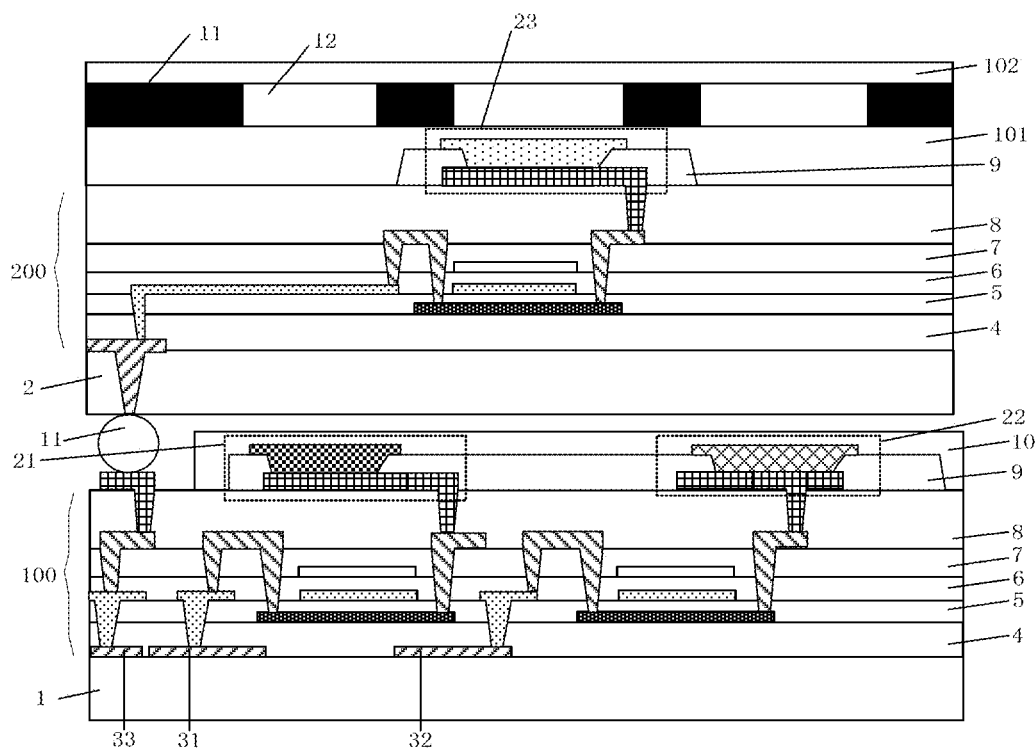
Figure 9:
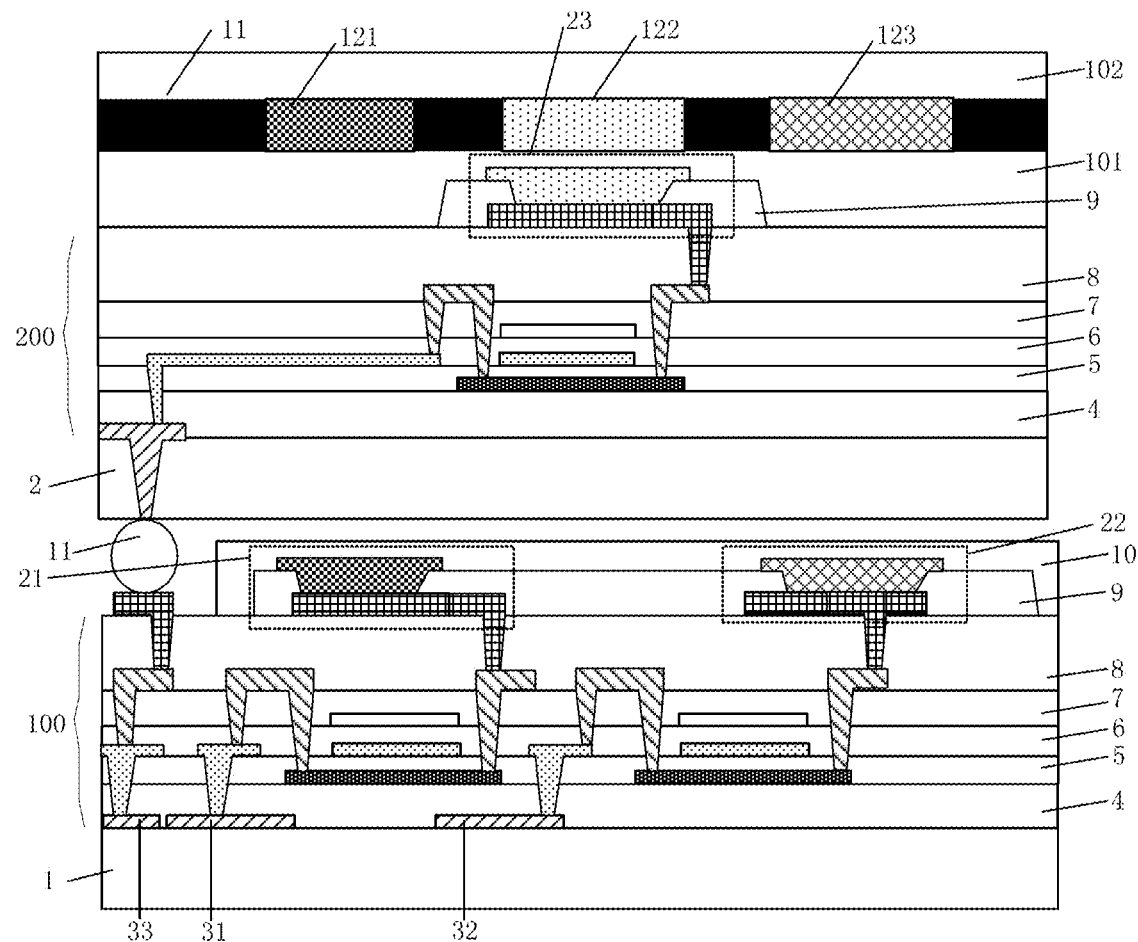

In some embodiments of the present application, referring to FIGS. 6 and 9, the display panel further includes a light-exiting-side encapsulation layer, and the light-exiting-side encapsulation layer covers the third sub-pixel 23. The light-exiting-side encapsulation layer includes at least a first encapsulation sublayer 101 and a second encapsulation sublayer 102. The black-matrix layer 11 is located between the first encapsulation sublayer 101 and the second encapsulation sublayer 102.

In an exemplary embodiment, referring to FIG. 6, the black-matrix layer 11 is located between the first encapsulation sublayer 101 and the second encapsulation sublayer 102, the light transmitting layer 12 is also located between the first encapsulation sublayer 101 and the second encapsulation sublayer 102, and the material of the light transmitting layer 12 shown in FIG. 6 is a colorless light transmitting material.

In an exemplary embodiment, referring to FIG. 9, the black-matrix layer 11 is located between the first encapsulation sublayer 101 and the second encapsulation sublayer 102, the light transmitting layer 12 is also located between the first encapsulation sublayer 101 and the second encapsulation sublayer 102, the light transmitting layer 12 includes the first optical filter 121, the second optical filter 122 and the third optical filter 123, the orthographic projection of the first optical filter 121 on the first substrate 1 and the orthographic projection of the first sub-pixel 21 on the first substrate 1 overlap, the orthographic projection of the second optical filter 122 on the first substrate 1 and the orthographic projection of the second sub-pixel 22 on the first substrate 1 overlap, and the orthographic projection of the third optical filter 123 on the first substrate 1 and the orthographic projection of the third sub-pixel 23 on the first substrate 1 overlap. The color of the first optical filter 121 and the color of the light emitted by the first sub-pixel 21 are the same, the color of the second optical filter 122 and the color of the light emitted by the second sub-pixel 22 are the same, and the color of the third optical filter 123 and the color of the light emitted by the third sub-pixel 23 are the same.

In the embodiments of the present application, by providing the black-matrix layer 11 and the light transmitting layer 12 between the first encapsulation sublayer 101 and the second encapsulation sublayer 102, in an aspect, the color purity of the displaying light rays of the emitted lights of the sub-pixels of the display panel are increased, and, in another aspect, the black-matrix layer 11 and the light transmitting layer 12 between the first encapsulation sublayer 101 and the second encapsulation sublayer 102 may serve to block water and oxygen to a certain extent, which may reduce the thickness of the encapsulation layer, to simplify the structure of the display panel.

In some embodiments of the present application, each of the first pixel driving circuit, the second pixel driving circuit and the third pixel driving circuit includes a transistor TFT. Each of the first sub-pixel 21, the second sub-pixel 22 and the third sub-pixel 23 includes a light emitting device.

The transistor in the first pixel driving circuit is electrically connected to the light emitting device of the first sub-pixel 21 and the first driving wire 31, the transistor in the second pixel driving circuit is electrically connected to the light emitting device of the second sub-pixel 22 and the second driving wire 32, and the transistor in the third pixel driving circuit is electrically connected to the light emitting device of the third sub-pixel 23 and the third driving wire 33.

In an exemplary embodiment, the light emitting device may include an organic light emitting diode (OLED), the organic light emitting diode may include a first electrode (for example, the anode), a light emitting functional layer, a second electrode (for example, the cathode) and a light enhancing layer (CPL layer). The color of the light emitting device is decided by the material of the light emitting functional layer.

As an example, the light emitting functional layer may include a hole injection layer, a hole transporting layer, an electron blocking layer, a luminescent layer, a hole blocking layer, an electron transporting layer and an electron injection layer.

In some embodiments of the present application, referring to FIG. 7, the display panel further includes a protecting layer (not shown), the protecting layer is located between the first driving base plate and the second driving base plate, and the protecting layer covers at least the electrically conducting unit 11.

That the protecting layer covers at least the electrically conducting unit 11 means that the protecting layer covers merely the electrically conducting unit 11, or the electrically conducting layer does not only cover the electrically conducting unit 11, but also covers the first sub-pixel 21 and the second sub-pixel 22 of the first driving base plate.

The protecting layer may be an insulating material, to serve to insulate and planarize.

In some embodiments of the present application, the display panel further includes a fixing unit, and the fixing unit is located between the first driving base plate and the second driving base plate; and the fixing unit includes an adhesively bonding layer or a fixing member.

In an exemplary embodiment, the fixing unit is located on the side of the protecting layer that is away from the first substrate 1.

In an exemplary embodiment, the adhesively bonding layer may include an optically clear adhesive (OCA).

In an exemplary embodiment, the fixing member may include a fixing support, a bolt and a nut.

In some embodiments of the present application, the first sub-pixel 21 includes a red-color light emitting device, the second sub-pixel 22 includes a green-color light emitting device, and the third sub-pixel 23 includes a blue-color light emitting device.

In some embodiments of the present application, the quantity of the driving base plates is equal to the quantity of the sub-pixels in one of the pixel units.

As an example, the display panel includes a first driving base plate, a second driving base plate and a third driving base plate that are sequentially stacked, and each of the pixel units includes a first sub-pixel, a second sub-pixel and a third sub-pixel;

the first sub-pixel is located between the first driving base plate and the second driving base plate, and is electrically connected to the driving unit in the first driving base plate;

the second sub-pixel is located between the second driving base plate and the third driving base plate, and is electrically connected to the driving unit in the second driving base plate; and the third sub-pixel is located on one side of the third driving base plate that is away from the first driving base plate, and is electrically connected to the driving unit in the third driving base plate.

In an exemplary embodiment, referring to FIG. 9, each of the driving base plates of the display panel includes a first electrically conducting layer located on its substrate, the first electrically conducting layer includes at least one driving wire, or the first electrically conducting layer includes a trace for connecting the sub-pixels and the driving wire (for example, a trace located adjacent to Via1). Each of the driving base plates of the display panel further includes a buffer layer (Buffer) 4, an active layer (Active), a first insulating layer (GI1) 5, a first grid layer (including a plurality of grids and traces), a second insulating layer (GI2) 6, a second grid layer (including a plurality of traces), an inter-layer dielectric layer (ILD) 7, a source-drain metal layer, a planarization layer (PLN) 8, an anode, a pixel defining layer (PDL) 9, a light emitting functional layer and a cathode located at least in the opening of the pixel defining layer 9, and a encapsulation layer 10.

The driving base plate on the light exiting side further includes the black-matrix layer 11 and the light transmitting layer 12, the encapsulation layer 10 of the driving base plate on the light exiting side includes the first encapsulation sublayer 101 and the second encapsulation sublayer 102, and the black-matrix layer 11 and the light transmitting layer 12 are located between the first encapsulation sublayer 101 and the second encapsulation sublayer 102, which may particularly refer to the above description, and is not discussed herein further.

An embodiment of the present application provides a displaying device, and the displaying device includes the display panel stated above.

In an exemplary embodiment, the displaying device is used for frame displaying. In this case, the emitted-light colors of the sub-pixels of the display panel are different, and the material of the light transmitting layer 12 includes color light transmitting materials, for example, color resistors of different colors or quantum dots of different colors.

The displaying device according to the embodiments of the present application includes the plurality of driving base plates, and the plurality of sub-pixels in one of the pixel units are located on the different driving base plates, and the quantity of the driving base plates of the displaying device is less than or equal to the quantity of the sub-pixels in one of the pixel units. Accordingly, in the fabrication of the displaying device, the plurality of driving base plates may be adhered together by using a matching-adhering technique, and the orientations of all of the driving base plates are the same. The fabrication of the displaying device prevents, as in the related art, fabricating all of the sub-pixels of one pixel unit on one driving base plate, and prevents the problem in the related art that the limitation by the fabricating process and the limitation by the size of the mask cause that the spacing between two neighboring sub-pixels may not be further reduced. Accordingly, the plurality of driving base plates may be adhered together by using a matching-adhering technique, and display products of a lower sub-pixel spacing may be designed and fabricated according to demands, thereby increasing the resolution of the displaying device.

An embodiment of the present application provides a light emitting apparatus, and the light emitting apparatus includes the display panel stated above.

In an exemplary embodiment, the displaying device is used for backlight displaying. In this case, the emitted-light colors of the sub-pixels of the display panel are the same, and the material of the light transmitting layer 12 includes a colorless light transmitting material.

The light emitting apparatus according to the embodiments of the present application includes the plurality of driving base plates, and the plurality of sub-pixels in one of the pixel units are located on the different driving base plates, and the quantity of the driving base plates of one light emitting apparatus is less than or equal to the quantity of the sub-pixels in one of the pixel units. Accordingly, in the fabrication of the light emitting apparatus, the plurality of driving base plates may be adhered together by using a matching-adhering technique, and the orientations of all of the driving base plates are the same. The fabrication of the light emitting apparatus prevents, as in the related art, fabricating all of the sub-pixels of one pixel unit on one driving base plate, and prevents the problem in the related art that the limitation by the fabricating process and the limitation by the size of the mask cause that the spacing between two neighboring sub-pixels may not be further reduced. Accordingly, the plurality of driving base plates may be adhered together by using a matching-adhering technique, and display products of a lower sub-pixel spacing may be designed and fabricated according to demands, thereby increasing the resolution of the light emitting apparatus.

Figure 14:
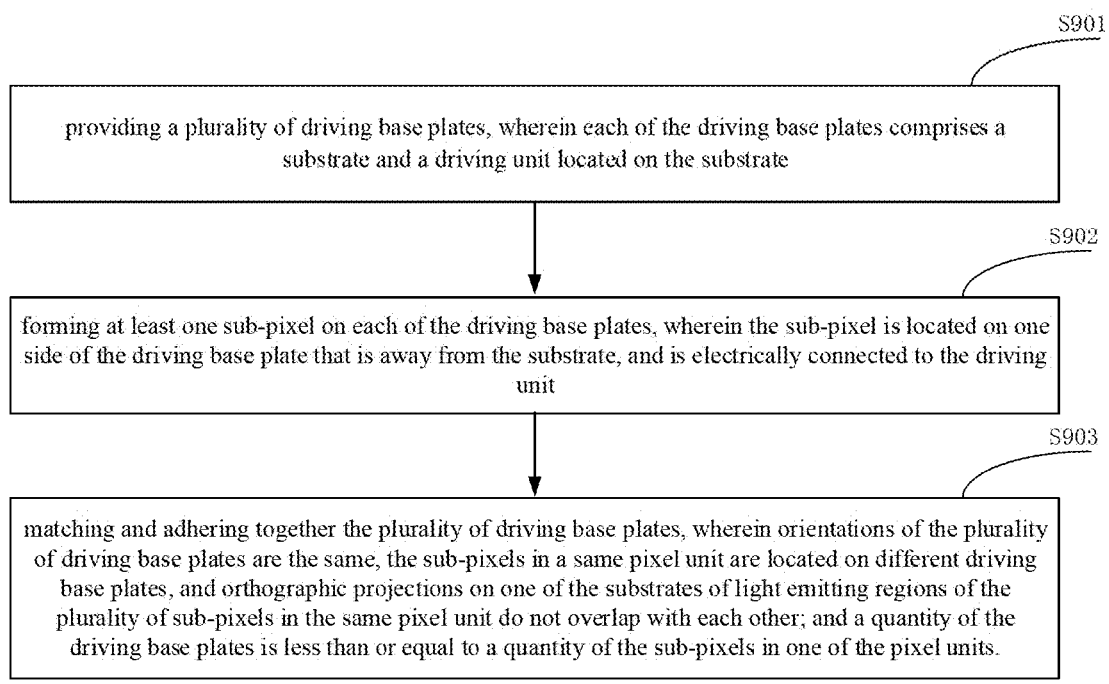
FIG. 14 is a flow chart of the method for fabricating a display panel according to an embodiment of the present application.

An embodiment of the present application provides a method for fabricating a display panel. Referring to FIG. 14, the method includes:

S901: providing a plurality of driving base plates, each of the driving base plates includes a substrate and a driving unit located on the substrate.

Each of the driving units of the driving base plates may include a pixel driving circuit and a trace connecting the pixel driving circuit and the driving chip of the display panel. The particular structure of the driving units is not limited herein, and may be determined according to practical situations.

In an exemplary embodiment, the substrate may be a flexible substrate, for example, polyimide (PI). Alternatively, the substrate may be a rigid substrate, for example, glass.

It should be noted that the particular method of fabricating the driving base plates of the display panel may refer to the related art, and is not discussed further herein.

S902: forming at least one sub-pixel on each of the driving base plates, the sub-pixel is located on one side of the driving base plate that is away from the substrate, and is electrically connected to the driving unit.

In an exemplary embodiment, the display panel includes two driving base plates, and the first part of the sub-pixels in a same pixel unit are located on the side of one of the driving base plates that is away from its substrate, and are electrically connected to its driving unit; and the second part of the sub-pixels in the same pixel unit are located on the side of the other of the driving base plates that is away from its substrate, and are electrically connected to its driving unit.

In an exemplary embodiment, when the quantity of the sub-pixels in one of the pixel units of the display panel is three, the display panel may include two driving base plates that are stacked, or the display panel may include three driving base plates that are stacked. The driving unit on each of the driving base plates is electrically connected to the at least one of the sub-pixels.

In an exemplary embodiment, the displaying colors of the sub-pixels included in one of the pixel units may be different. For example, the sub-pixels in one of the pixel units display the red color, the green color and the blue color, respectively. Alternatively, the sub-pixels in one of the pixel units display the red color, the green color, the blue color and the white color, respectively.

S903: matching and adhering together the driving base plates, orientations of the plurality of driving base plates are the same, the sub-pixels in a same pixel unit are located on different driving base plates, and orthographic projections on one of the substrates of light emitting regions of the sub-pixels in the same pixel unit do not overlap with each other; and a quantity of the driving base plates is less than or equal to a quantity of the sub-pixels in one of the pixel units.

In an exemplary embodiment, the display panel includes a plurality of driving base plates, and the quantity of the driving base plates is less than or equal to the quantity of the sub-pixels in one of the pixel units. It can be understood that the display panel may include at least two driving base plates, and may include at most N driving base plates, and N refers to the quantity of the sub-pixels included in one of the pixel units of the display panel. The quantity of the sub-pixels included in one of the pixel units is not limited herein, which may be particularly determined according to practical situations.

In the embodiments of the present application, the plurality of driving base plates are provided, so that the plurality of sub-pixels in one of the pixel units are located on the different driving base plates, and the quantity of the driving base plates of the display panel is less than or equal to the quantity of the sub-pixels in one of the pixel units. Accordingly, in the fabrication of the display panel, the plurality of driving base plates may be adhered together by using a matching-adhering technique, and the orientations of all of the driving base plates are the same.

Accordingly, the fabrication of the display panel prevents, as in the related art, fabricating all of the sub-pixels of one pixel unit on one driving base plate, and prevents the problem in the related art that the limitation by the fabricating process and the limitation by the size of the mask cause that the spacing between two neighboring sub-pixels may not be further reduced. Accordingly, the plurality of driving base plates may be adhered together by using a matching-adhering technique, and display products of a lower sub-pixel spacing may be designed and fabricated according to demands, thereby increasing the resolution of the display panel, to improve the effect of displaying of the display panel.

The methods of fabricating the other components of the display panel according to the embodiments of the present application may be determined by referring to the fabricating methods in the related art, and are not discussed herein further.

The above are merely particular embodiments of the present application, and the protection scope of the present application is not limited thereto. All of the variations or substitutions that a person skilled in the art may easily envisage within the technical scope disclosed by the present application should fall within the protection scope of the present application. Therefore, the protection scope of the present application should be subject to the protection scope of the claims.

The invention claimed is:

1. A display panel, comprising:
a plurality of driving base plates that are stacked, wherein each of the driving base plates comprises a substrate and a driving unit located on the substrate, and orientations of the plurality of driving base plates are the same; and
a plurality of pixel units that are arranged in an array, wherein each of the pixel units comprises a plurality of sub-pixels, and orthographic projections on the substrate of light emitting regions of the plurality of sub-pixels in the same pixel unit do not overlap with each other; and each of the driving base plates is provided with at least one of the sub-pixels on one side that is away from the substrate, and the driving unit on each of the driving base plates is electrically connected to the at least one of the sub-pixels, wherein:
a quantity of the driving base plates is less than a quantity of the sub-pixels in one of the pixel units;
the display panel comprises a first driving base plate and a second driving base plate, and each of the pixel units comprises a first sub-pixel, a second sub-pixel and a third sub-pixel;
the first driving base plate comprises a first substrate and a plurality of first driving units located on the first substrate, and the second driving base plate comprises a second substrate and a plurality of second driving units located on the second substrate;
the second substrate is located on one side of the first driving units that is away from the first substrate, and the second substrate is located between the first driving units and the second driving units;
the first sub-pixel and the second sub-pixel are located on the side of the first driving units that is away from the first substrate, and both of the first sub-pixel and the second sub-pixel are electrically connected to the first driving units;
the third sub-pixel is located on one side of the second driving units that is away from the second substrate, and the third sub-pixel is electrically connected to the second driving units;
each of the first driving units comprises a first pixel driving circuit and a second pixel driving circuit, and each of the second driving units comprises a third pixel driving circuit;
the first sub-pixel is electrically connected to the first pixel driving circuit, the second sub-pixel is electrically connected to the second pixel driving circuit, and the third sub-pixel is electrically connected to the third pixel driving circuit;
each of the first driving units further comprises a first driving wire, a second driving wire and a third driving wire that are located on the first substrate; and
the first driving wire, the second driving wire and the third driving wire are arranged in a same layer, the first driving wire is electrically connected to the first pixel driving circuit, the second driving wire is electrically connected to the second pixel driving circuit, and the third driving wire is electrically connected to the third pixel driving circuit.

2. The display panel according to claim 1, wherein the display panel further comprises an electrically conducting unit, the electrically conducting unit is located between the second substrate and the first driving units, and an orthographic projection of the electrically conducting unit on the first substrate and orthographic projections of the light emitting regions of the plurality of sub-pixels on the first substrate do not overlap with each other;
the second substrate is provided with an extending-throughout first via hole, an orthographic projection of the first via hole on the first substrate and the orthographic projection of the electrically conducting unit on the first substrate overlap, each of the first driving units is provided with a second via hole, and an orthographic projection of the second via hole on the first substrate and the orthographic projection of the electrically conducting unit on the first substrate overlap; and
the third pixel driving circuit is electrically connected to the third driving wire via sequentially the first via hole, the electrically conducting unit and the second via hole.

3. The display panel according to claim 2, wherein the display panel further comprises a protecting layer, the protecting layer is located between the first driving base plate and the second driving base plate, and the protecting layer covers at least the electrically conducting unit.

4. The display panel according to claim 1, wherein the display panel further comprises a black-matrix layer, and the black-matrix layer is located on one side of the third sub-pixel that is away from the second substrate; and
an orthographic projection of the black-matrix layer on the first substrate and orthographic projections of the light emitting regions of the plurality of sub-pixels on the first substrate do not overlap with each other.

5. The display panel according to claim 4, wherein the display panel further comprises a light transmitting layer, the light transmitting layer and the black-matrix layer are located in a same layer, and an orthographic projection of the light transmitting layer on the first substrate and orthographic projections of the light emitting regions of the plurality of sub-pixels on the first substrate overlap.

6. The display panel according to claim 5, wherein the light transmitting layer comprises a first optical filter, a second optical filter and a third optical filter;
   an orthographic projection of the first optical filter on the first substrate and an orthographic projection of a light emitting region of the first sub-pixel on the first substrate overlap, an orthographic projection of the second optical filter on the first substrate and an orthographic projection of a light emitting region of the second sub-pixel on the first substrate overlap, and an orthographic projection of the third optical filter on the first substrate and an orthographic projection of a light emitting region of the third sub-pixel on the first substrate overlap; and
   a color of the first optical filter and a color of a light emitted by the first sub-pixel are the same, a color of the second optical filter and a color of a light emitted by the second sub-pixel are the same, and a color of the third optical filter and a color of a light emitted by the third sub-pixel are the same.

7. The display panel according to claim 4, wherein the display panel further comprises a light-exiting-side encapsulation layer, and the light-exiting-side encapsulation layer covers the third sub-pixel;
   the light-exiting-side encapsulation layer comprises at least a first encapsulation sublayer and a second encapsulation sublayer; and
   the black-matrix layer is located between the first encapsulation sublayer and the second encapsulation sublayer.

8. The display panel according to claim 1, wherein each of the first pixel driving circuit, the second pixel driving circuit and the third pixel driving circuit comprises a transistor;
   each of the first sub-pixel, the second sub-pixel and the third sub-pixel comprises a light emitting device; and
   the transistor in the first pixel driving circuit is electrically connected to the light emitting device of the first sub-pixel and the first driving wire, the transistor in the second pixel driving circuit is electrically connected to the light emitting device of the second sub-pixel and the second driving wire, and the transistor in the third pixel driving circuit is electrically connected to the light emitting device of the third sub-pixel and the third driving wire.

9. The display panel according to claim 1, wherein the display panel further comprises a fixing unit, and the fixing unit is located between the first driving base plate and the second driving base plate; and
   the fixing unit comprises an adhesively bonding layer or a fixing member.

10. The display panel according to claim 1, wherein the first sub-pixel comprises a red-color light emitting device, the second sub-pixel comprises a green-color light emitting device, and the third sub-pixel comprises a blue-color light emitting device.

11. A displaying device, wherein the displaying device comprises the display panel according to claim 1.

12. A display panel, comprising:
   a plurality of driving base plates that are stacked, wherein each of the driving base plates comprises a substrate and a driving unit located on the substrate, and orientations of the plurality of driving base plates are the same; and
   a plurality of pixel units that are arranged in an array, wherein each of the pixel units comprises a plurality of sub-pixels, and orthographic projections on the substrate of light emitting regions of the plurality of sub-pixels in the same pixel unit do not overlap with each other; and each of the driving base plates is provided with at least one of the sub-pixels on one side that is away from the substrate, and the driving unit on each of the driving base plates is electrically connected to the at least one of the sub-pixels, wherein:
   a quantity of the driving base plates is equal to a quantity of the sub-pixels in one of the pixel units;
   the display panel comprises a first driving base plate, a second driving base plate and a third driving base plate that are sequentially stacked, and each of the pixel units comprises a first sub-pixel, a second sub-pixel and a third sub-pixel;
   the first sub-pixel is located between the first driving base plate and the second driving base plate, and is electrically connected to the driving unit in the first driving base plate;
   the second sub-pixel is located between the second driving base plate and the third driving base plate, and is electrically connected to the driving unit in the second driving base plate; and
   the third sub-pixel is located on one side of the third driving base plate that is away from the first driving base plate, and is electrically connected to the driving unit in the third driving base plate.

13. A light emitting apparatus, wherein the light emitting apparatus comprises the display panel according to claim 1.

14. A method for fabricating a display panel, comprising:
   providing a plurality of driving base plates, wherein each of the driving base plates comprises a substrate and a driving unit located on the substrate;
   forming at least one sub-pixel on each of the driving base plates, wherein the sub-pixel is located on one side of the driving base plate that is away from the substrate, and is electrically connected to the driving unit; and
   matching and adhering together the plurality of driving base plates, wherein orientations of the plurality of driving base plates are the same, the sub-pixels in a same pixel unit are located on different driving base plates, and orthographic projections on one of the substrates of light emitting regions of the plurality of sub-pixels in the same pixel unit do not overlap with each other; and a quantity of the driving base plates is less than a quantity of the sub-pixels in one of the pixel units, wherein:
   the display panel comprises a first driving base plate and a second driving base plate, and each of the pixel units comprises a first sub-pixel, a second sub-pixel and a third sub-pixel;
   the first driving base plate comprises a first substrate and a plurality of first driving units located on the first substrate, and the second driving base plate comprises a second substrate and a plurality of second driving units located on the second substrate;
   the second substrate is located on one side of the first driving units that is away from the first substrate, and the second substrate is located between the first driving units and the second driving units;
   the first sub-pixel and the second sub-pixel are located on the side of the first driving units that is away from the first substrate, and both of the first sub-pixel and the second sub-pixel are electrically connected to the first driving units;

the third sub-pixel is located on one side of the second driving units that is away from the second substrate, and the third sub-pixel is electrically connected to the second driving units;

each of the first driving units comprises a first pixel driving circuit and a second pixel driving circuit, and each of the second driving units comprises a third pixel driving circuit;

the first sub-pixel is electrically connected to the first pixel driving circuit, the second sub-pixel is electrically connected to the second pixel driving circuit, and the third sub-pixel is electrically connected to the third pixel driving circuit;

each of the first driving units further comprises a first driving wire, a second driving wire and a third driving wire that are located on the first substrate; and the first driving wire, the second driving wire and the third driving wire are arranged in a same layer, the first driving wire is electrically connected to the first pixel driving circuit, the second driving wire is electrically connected to the second pixel driving circuit, and the third driving wire is electrically connected to the third pixel driving circuit.

* * * * *